(12) United States Patent
English

(10) Patent No.: US 10,383,244 B2
(45) Date of Patent: Aug. 13, 2019

(54) ELECTRONICS ENCLOSURE ASSEMBLY AND METHODS OF FORMING THE SAME

(71) Applicant: Regal Beloit America, Inc., Beloit, WI (US)

(72) Inventor: Stephen Thomas English, Englewood, OH (US)

(73) Assignee: REGAL BELOIT AMERICA, INC., Beloit, WI (US)

(*) Notice: Subject to any disclaimer, the term of this patent is extended or adjusted under 35 U.S.C. 154(b) by 0 days.

(21) Appl. No.: 15/466,170

(22) Filed: Mar. 22, 2017

(65) Prior Publication Data

US 2018/0279493 A1  Sep. 27, 2018

(51) Int. Cl.
| H05K 5/02 | (2006.01) |
| H05K 7/14 | (2006.01) |
| G06F 1/16 | (2006.01) |
| H02G 3/08 | (2006.01) |

(52) U.S. Cl.
CPC ......... *H05K 7/1432* (2013.01); *H05K 5/0217* (2013.01); *G06F 1/1656* (2013.01); *H02G 3/081* (2013.01); *H02G 3/088* (2013.01)

(58) Field of Classification Search
CPC ...... H02G 3/088; H02G 3/081; H05K 5/0217; G06F 1/1656
See application file for complete search history.

(56) References Cited

U.S. PATENT DOCUMENTS

| 5,159,155 A * | 10/1992 | Nishihara ........ H01R 13/5227 174/50 |
| 6,166,327 A * | 12/2000 | Saito ................... H02G 3/088 174/135 |
| D461,120 S * | 8/2002 | Ostro ............................ D9/759 |
| 8,023,272 B2 | 9/2011 | Shimizu |
| 8,266,984 B2 | 9/2012 | Miller et al. |
| 8,973,879 B2 | 3/2015 | Kodama et al. |
| 2008/0094232 A1* | 4/2008 | Yokote ................ G06F 1/1616 340/604 |
| 2010/0263901 A1* | 10/2010 | Doring ................... H02G 5/02 174/68.2 |
| 2010/0309622 A1* | 12/2010 | Zimmermann ....... G06F 1/1632 361/679.41 |
| 2011/0253591 A1* | 10/2011 | Lee ................... H01L 21/67353 206/710 |
| 2015/0207379 A1 | 7/2015 | Muller et al. |
| 2015/0244034 A1* | 8/2015 | Taga .................. H01M 10/613 320/107 |
| 2016/0190892 A1 | 6/2016 | Johnson et al. |

FOREIGN PATENT DOCUMENTS

EP  0940352  * 9/1999

* cited by examiner

*Primary Examiner* — James Wu
(74) *Attorney, Agent, or Firm* — Armstrong Teasdale LLP

(57) ABSTRACT

An electronics enclosure assembly includes a housing comprising a first chamber, a second chamber, and a first wall coupled between the first chamber and the second chamber. The electronics enclosure assembly also includes at least one plate coupled to the housing. The first wall and the plate combine to define a first channel extending through the first wall. The first channel couples the first chamber in communication with the second chamber.

16 Claims, 8 Drawing Sheets

ELECTRONICS ENCLOSURE ASSEMBLY AND METHODS OF FORMING THE SAME

BACKGROUND

The field of the disclosure relates generally to electronics enclosures, and more specifically, to electronics enclosures including a channel through which to insert electrical connections between electrical components.

Electronic components for variable speed motors are by nature sensitive to physical and environmental factors. In order to provide the necessary protection for them to reliably operate as designed, the electrical components require an enclosure that prevents destructive factors from having an impact. One challenge for at least some known enclosures is to sufficiently seal the sensitive electronics from the potentially harmful outside environment while still allowing a technician access to the a portion of the electronics through the enclosure for data and power connections.

One known approach is to attempt sealing the path between the wiring and the electronics area using potted connectors. However, this approach limits the design options for the wiring compartment due to the need to get tooling actions or machining operations into the space to make a clean and sealable opening. Second, there is a significant cost impact to providing sealed or potted pathways. Finally, the potted sealing approach reduces the number of wires/conductors that can be passed through the space, since the connector or potting needs to be able to seal completely around each individual line. The second known approach is to bring a portion of the board through an opening from the electronics compartment to the wiring compartment. In this way, the installer can connect their power and data lines directly to the board. However, this approach requires exposing a portion of the board within the wiring compartment, which increases the risk of the debris or other physical hazards impacting the board.

BRIEF DESCRIPTION

In one aspect, an electronics enclosure assembly is provided. The electronics enclosure assembly includes a housing comprising a first chamber, a second chamber, and a first wall coupled between the first chamber and the second chamber. The electronics enclosure assembly also includes at least one plate coupled to the housing. The first wall and the plate combine to define a first channel extending through the first wall. The first channel couples the first chamber in communication with the second chamber.

In another aspect, a housing for use with an electronics enclosure assembly is provided. The housing includes a first chamber, a second chamber, and a first wall coupled between the first chamber and the second chamber. The housing also includes a first channel extending through the first wall, wherein the first channel couples the first chamber in communication with the second chamber. The first channel includes a bottom opening, a first sidewall extending between the bottom opening and the first chamber, and a second sidewall extending between the bottom opening and the second chamber, wherein at least one of the first and the second sidewalls is obliquely oriented.

In yet another aspect, a method of forming an electronics enclosure assembly is provided. The method includes positioning a first wall between a first chamber and a second chamber in a housing and forming a first channel through the first wall to couple the first chamber in communication with the second chamber, wherein the first channel includes a bottom opening. The method also includes coupling a plate to the housing such that the plate covers the bottom opening, wherein the plate at least partially defines the first channel.

Although specific features of various embodiments may be shown in some drawings and not in others, this is for convenience only. Any feature of any drawing may be referenced and/or claimed in combination with any feature of any other drawing.

DETAILED DESCRIPTION

Figure 1:
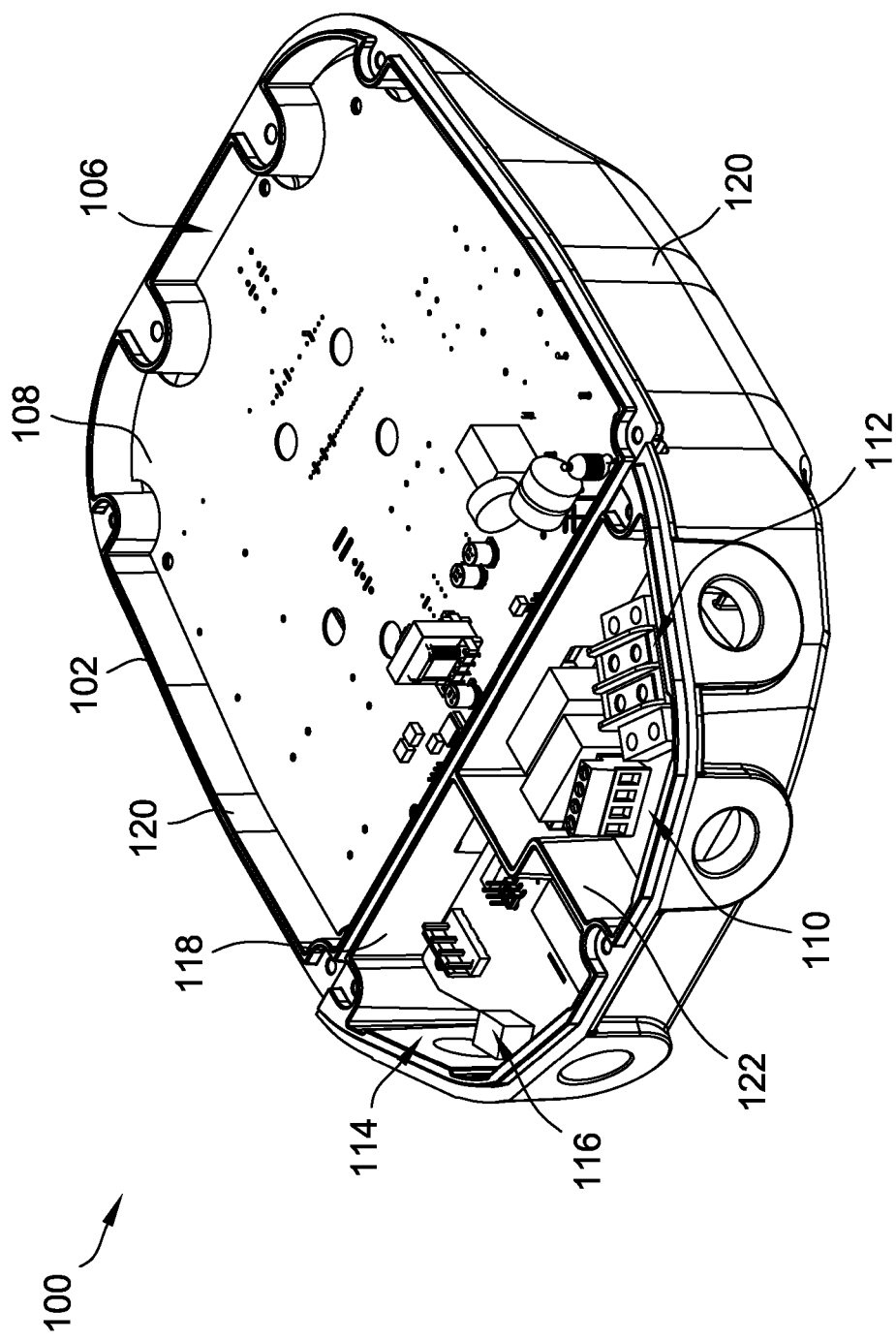
FIG. 1 is a perspective top view of an exemplary electronics enclosure assembly.
Figure 2:
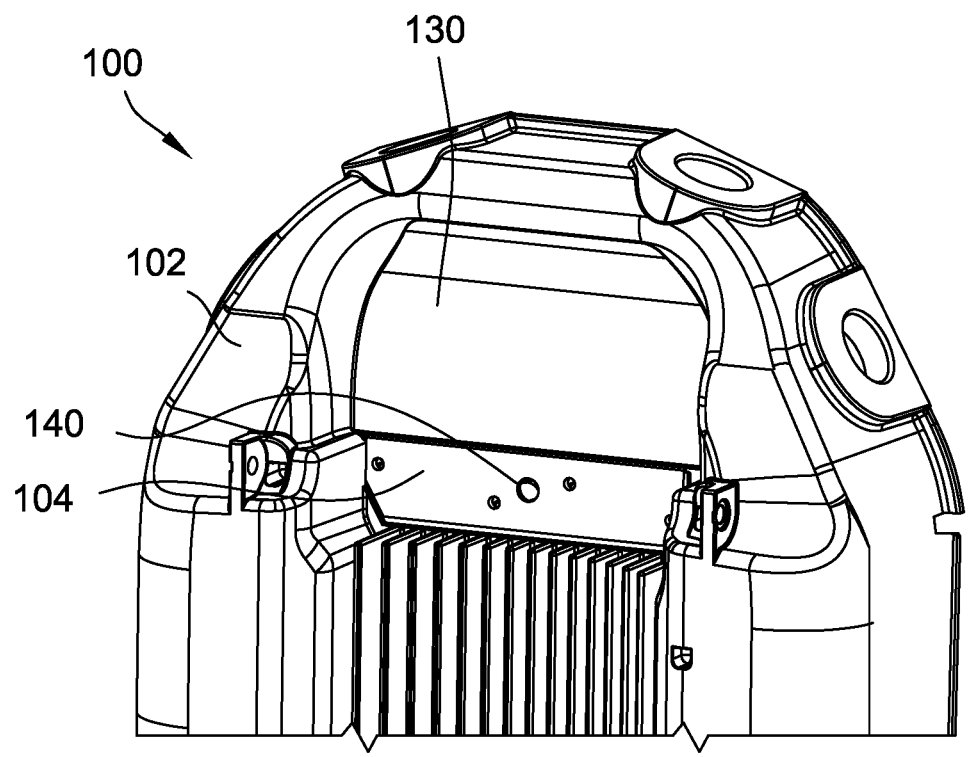
FIG. 2 is a perspective bottom view of the electronics enclosure assembly.
Figure 3:
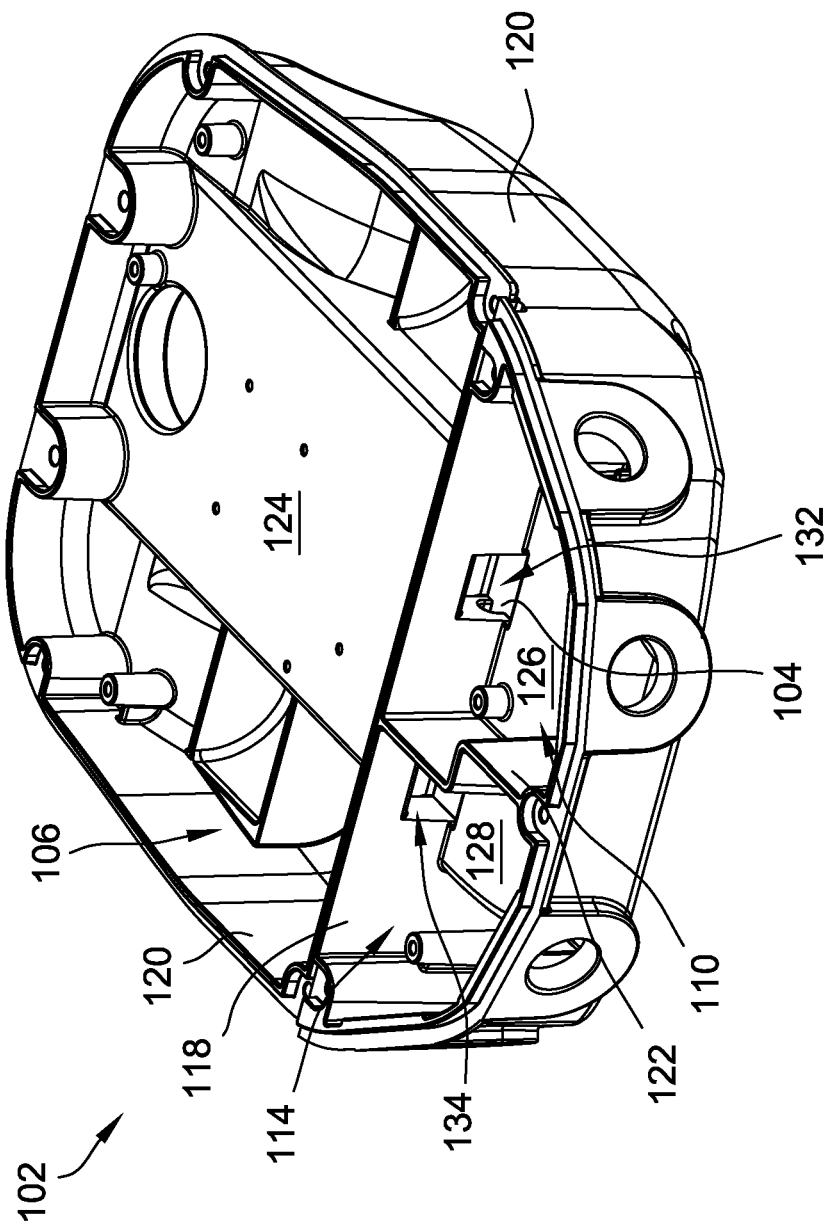
FIG. 3 is a perspective top view of an exemplary housing for use with the electronics enclosure assembly shown in FIG. 1.
Figure 4:
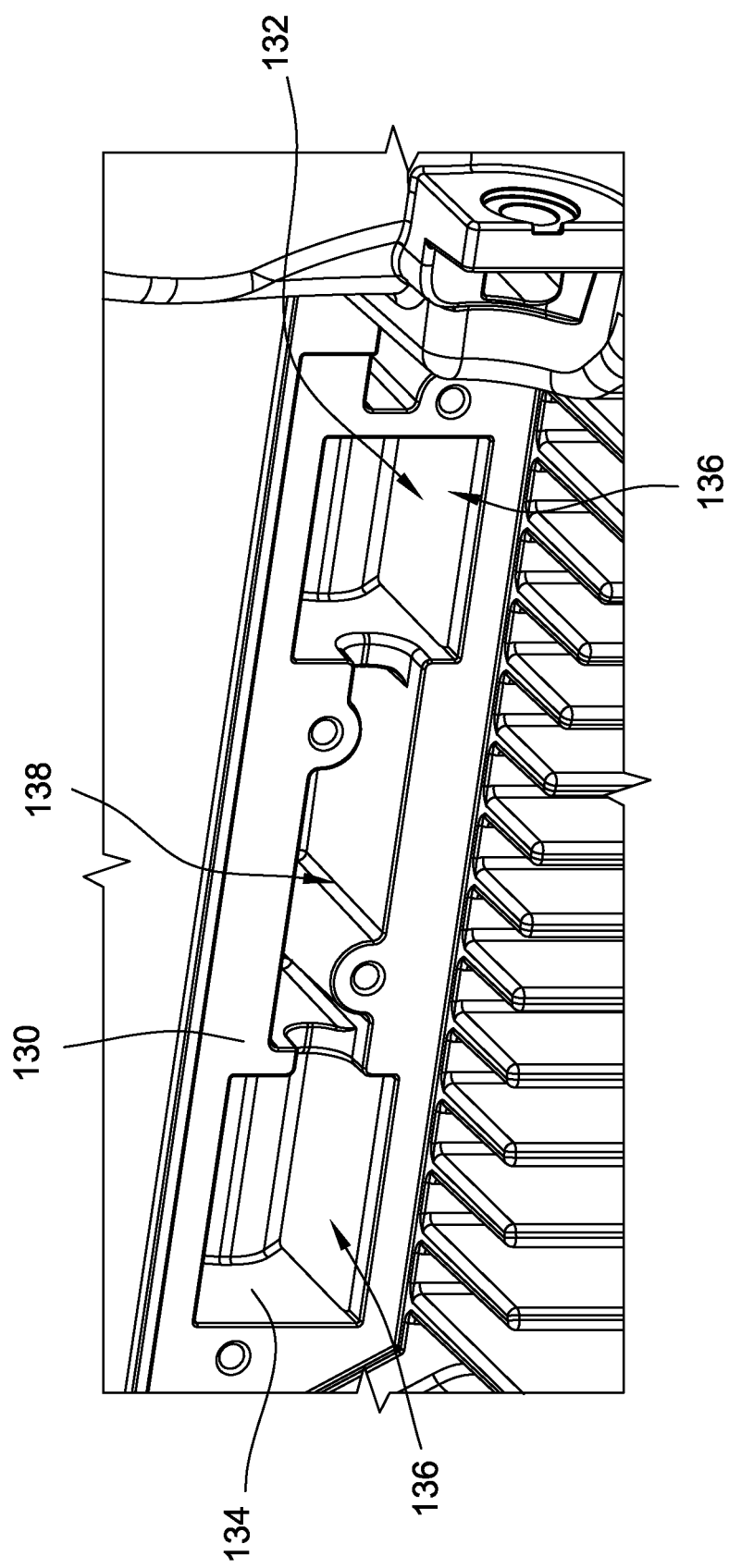
FIG. 4 is an enlarged perspective bottom view of the housing shown in FIG. 3.

FIG. 1 is a perspective top view of an exemplary electronics enclosure assembly 100. FIG. 2 is a perspective bottom view of electronics enclosure assembly 100. FIG. 3 is a perspective top view of an exemplary housing 102 for use with electronics enclosure assembly 100 (shown in FIG. 1). FIG. 4 is an enlarged perspective bottom view of housing 102.

In the exemplary embodiment, electronics enclosure assembly 100 includes housing 102 and a plate 104 coupled to housing 102. Housing 102 includes an electronics chamber 106 that houses an electronics panel 108, a first wiring chamber 110 that houses a first plurality of electrical components 112, and a second wiring chamber 114 that houses a second plurality of electrical components 116. A first divider wall 118 extends between opposing sidewalls 120 of housing to divide electronics chamber 106 from wiring chambers 110 and 114. Housing 102 also includes a second divider wall 122 to separate first wiring chamber 110 from second wiring chamber 114. Electronics chamber 106 includes a bottom surface 124 to which electronics panel 106 is coupled. Similarly, each of first and second wiring panels 110 and 114 include a bottom surface 126 and 128, respectively, to which electrical components 112 and 116 are coupled, respectively. As best shown in FIG. 2, plate 104 is coupled to a surface 130 of housing 102 opposite chambers 106, 110, and 114 and is aligned with first wall 118.

In the exemplary embodiment, electronics panel 108 is a control panel for a variable speed electrical motor, first wiring chamber 110 houses high voltage electronical components 112 for connecting with panel 108, and second wiring chamber 110 houses low voltage electronical components 116 for connecting with panel 108. Alternatively, chambers 106, 110, and 114 of housing 102 may house any objects or articles that facilitates operation of enclosure assembly 100 as described herein. As described below, a technician is provided access to wiring chambers 110 and 114 to make connections between panel 108 and electronical components 112 and 116, but the technician is prevented from accessing electronics chamber 106.

As best shown in FIGS. 3 and 4, housing 102 includes a first channel 132 and a second channel 134 defines through first wall 118. More specifically, first channel 132 is defined through first wall 118 and couples electronics chamber 106 in communication with first wiring chamber 110, and second channel 134 is defined through first wall 118 and couples electronics chamber 106 in communication with second wiring chamber 114. As shown in FIG. 4, where plate 104 has been removed for clarity, each channel 132 and 134 includes a bottom opening 136 formed in surface 130 of housing 102. In the exemplary embodiment, plate 104 is coupled to surface 130 such that plate covers openings 136. As such, plate 104 forms a bottom surface of channels 132 and 134 and at least partially defines both channels 132 and 134. Furthermore, first wall 118 includes a wall chamber 138 defined therein and positioned between channels 132 and 134 such that wall chamber 138 couples first channel 132 in communication with second channel 134. As shown in FIG. 2, plate 104 includes a single outlet opening 140 aligned with wall chamber 138. In operation, as described in further detail below, moisture is collected within channels 132 and 134 and is directed towards wall chamber 138 when the moisture will exit assembly 100 via outlet opening 140 in plate 104.

Figure 5:
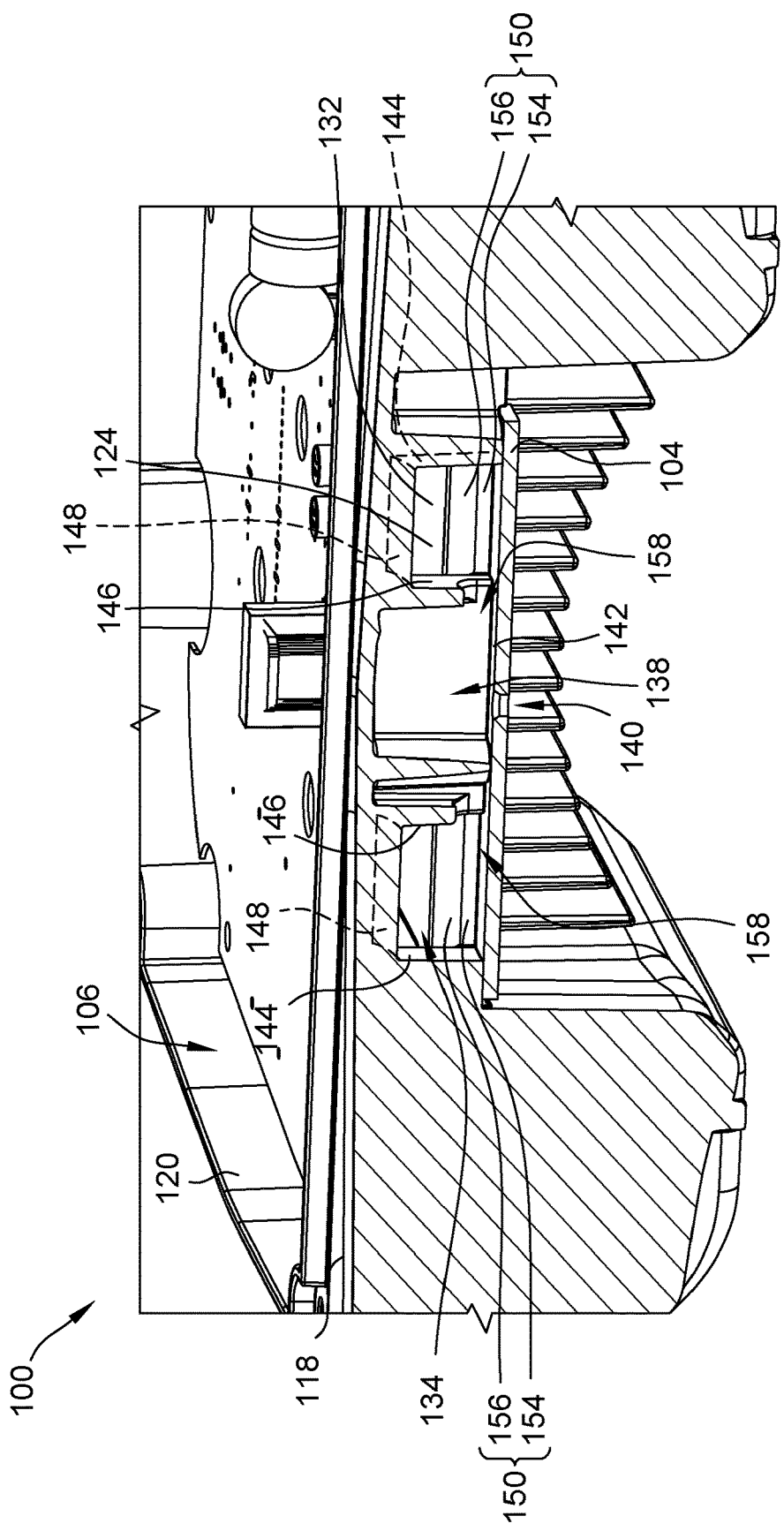
FIG. 5 is a cross-sectional view of the electronics enclosure assembly shown in FIG. 1 illustrating the first side of the pair of channels shown in FIG. 5.
Figure 6:
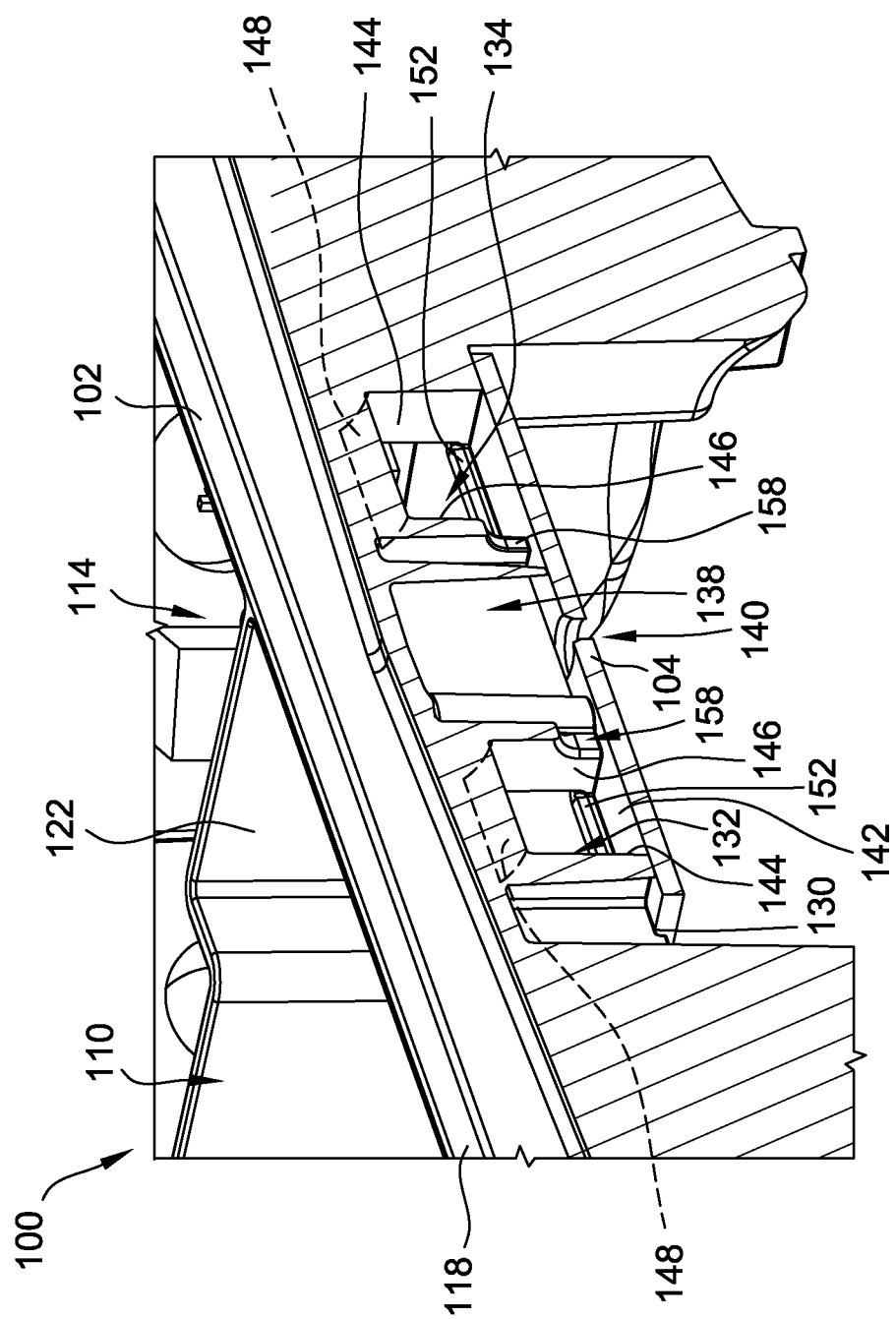
FIG. 6 is a cross-sectional view of the electronics enclosure assembly shown in FIG. 1 illustrating the second side of the pair of channels shown in FIG. 5.
Figure 7:
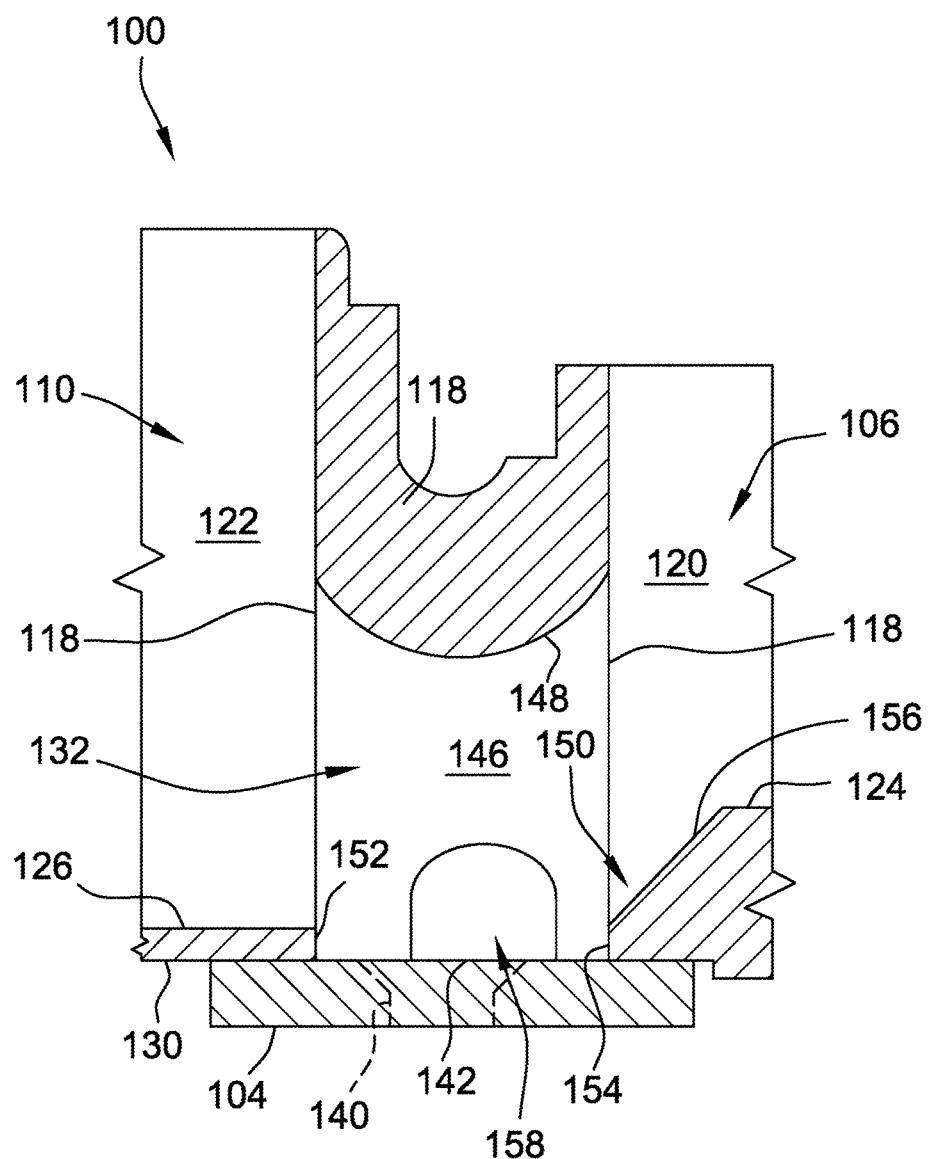
FIG. 7 is a cross-sectional view of the electronics enclosure assembly shown in FIG. 1 taken perpendicular to the cross-sectional views in FIGS. 5 and 6.

FIG. 5 is a cross-sectional view of electronics enclosure assembly 100 illustrating a first side of channels 132 and 134. FIG. 6 is a cross-sectional view of electronics enclosure assembly 100 illustrating a second side channels 132 and 134. FIG. 7 is a cross-sectional view of electronics enclosure assembly 100 taken perpendicular to the cross-sectional views in FIGS. 5 and 6.

In the exemplary embodiment, plate 104 includes a plate surface 142 that at least partially defines channels 132 and 134 and also at least partially defines wall chamber 136. As best shown in FIG. 7, plate surface 142 is both vertically offset from and parallel to surface 124 of electronics chamber 106 and to surfaces 126 and 128 of first wiring chamber 110 and second wiring chamber 114, respectively. More specifically, plate surface 142 is positioned below the planes of surfaces 124, 126, and 128. In such a configuration, wires (not shown) that pass through channels 132 and 134 first turn downward when exiting electronics chamber 106 and then turn back upward to enter either of wiring chambers 110 and 114. As such, any moisture on the wires or on surfaces 124, 126, and 128 is guided to channels 132 and 134 as the low-point of housing 102. As described herein the collected moisture is directed to wall chamber 138 and out of assembly 100 through outlet opening 140 in plate 104.

As shown in FIGS. 5-7, each channel 132 and 134 is defined by plate surface 142, an outer endwall 144, an inner endwall 146, a top wall 148, a first sidewall 150, and a second sidewall 152. Because channels 132 and 134 are similarly configured, only channel 132 is described below for clarity.

In the exemplary embodiment, first sidewall 150 extends between plate 104 (or bottom opening 136) and surface 124 of electronics chamber 106, and second sidewall extends between plate 104 (or bottom opening 136) and surface 126 of first wiring chamber 110. As shown in FIG. 7, at least one of sidewalls 150 and 152 are obliquely oriented with respect to plate surface 142 to facilitate collecting fluid within channel 132. More specifically, portions of both sidewalls 150 and 152 are obliquely oriented with respect to plate surface 142 such that channel 132 is one of V-shaped or U-shaped.

In the exemplary embodiment, first sidewall 150 includes a first portion 154 extending from plate 104 (or bottom opening 136) toward surface 124 of chamber 106 and a second portion 156 extending from surface 124 of chamber 106 toward plate 104 (or bottom opening 136). In the exemplary embodiment, first portion 154 is substantially perpendicular to plate surface 142 and to surface 124 of chamber 106, and second portion 156 is obliquely oriented with respect to plate surface 142 and to surface 124 of chamber 106. In other embodiments, first portion 154 is obliquely oriented to plate surface 142 and to surface 124 of chamber 106 and second portion 156 is perpendicular to plate surface 142 and to surface 124 of chamber 106, or both portions 154 and 156 are obliquely oriented to plate surface 142 and to surface 124 of chamber 106. Generally, first and second portions 154 and 156 of first sidewall 150 include any orientation to facilitate operation of assembly 100 as described herein.

As shown in FIGS. 5-7, inner endwalls 152 of channels 132 and 134 each include an opening 158 that couples respective channel 132 and 134 in communication with wall chamber 138. Openings 158 enable moisture to be directed from channels 132 and 134 into wall chamber 138 and then through outlet 140 in plate 104.

Figure 8:
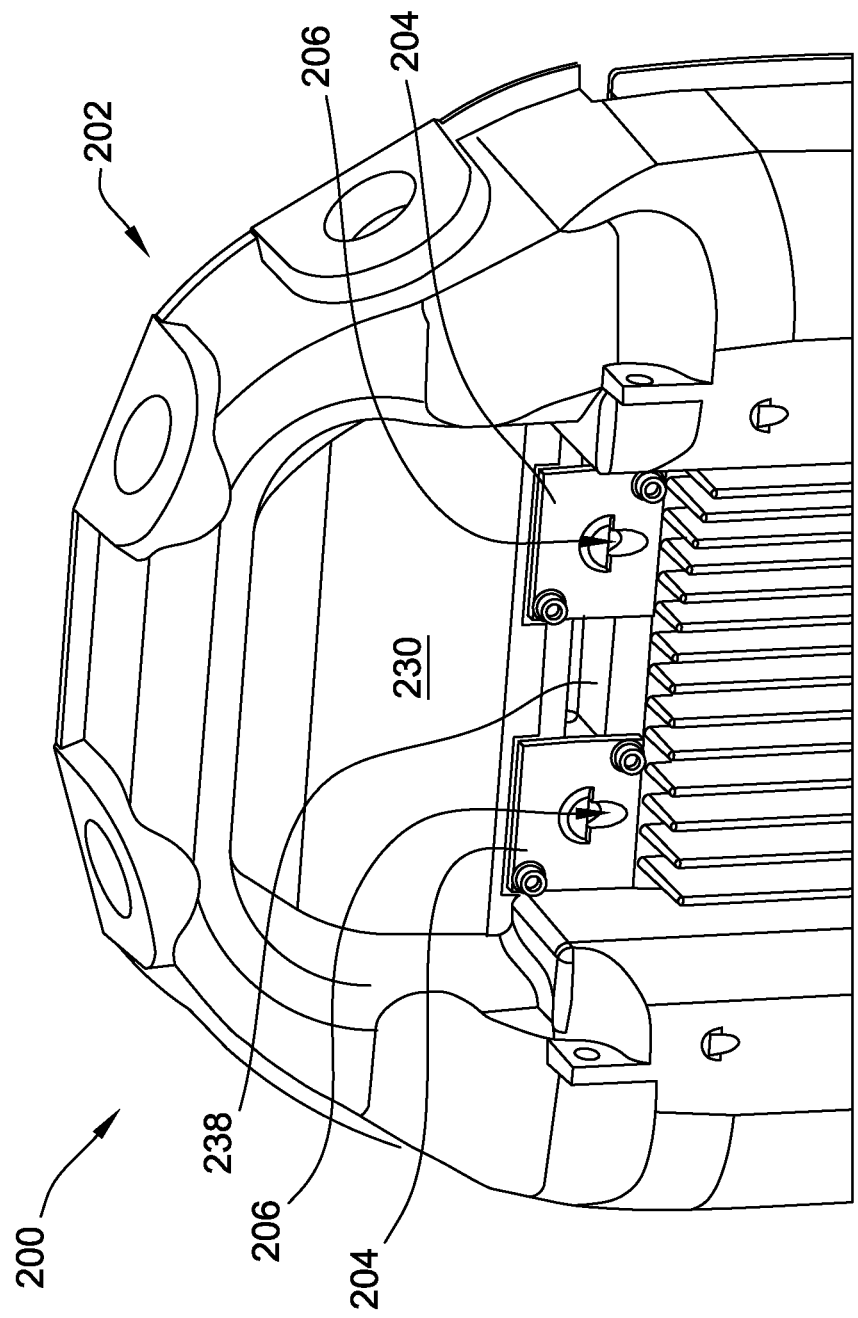
FIG. 8 is a perspective bottom view of an alternative electronics enclosure assembly.

FIG. 8 is a perspective bottom view of an alternative electronics enclosure assembly 200 including a housing 202 and a pair of plates 204 coupled to a bottom surface 230 of housing 202. Housing 202 is substantially similar to housing 102 with the exception that the channels of housing 202 do not include openings 158 to couple the channels in communication with a wall chamber 238 of housing 202. As shown in FIG. 8, a plate 204 is coupled to surface 230 proximate each channel such that each plate 204 partially defines one of the channels formed in housing 202. Each plate 204 includes an opening 206 aligned with its corresponding channel such that moisture collected in the channel is drained through opening 206 and out of assembly 200.

The apparatus, methods, and systems described herein provide an electronics enclosure assembly that protects the sensitive electronics in a manufacturer's portion of the assembly while still enabling a technician access to a wiring portion of the assembly to make electrical connections between corresponding components in the respective portions. More specifically, the assembly includes a housing having a first chamber, a second chamber, and a first wall coupled between the first chamber and the second chamber. The assembly also includes at least one plate coupled to the housing such that the first wall of the housing and the plate combine to define a first channel extending through the first wall, wherein the first channel couples the first chamber in communication with the second chamber. The channel is positioned lower than the first and second chambers to form a pocket in which moisture can be trapped to prevent it from affecting the electrical components within either chamber. As such, wires that pass through the channels first turn downward when exiting one chamber and then turn back upward to enter the other chamber. In such a configuration, any moisture buildup on the wires collects in the channel and is guided out of the assembly through an opening in the plate.

Technical effects of the electronics enclosure assembly described herein include: 1) prevents moisture from reaching sensitive electronics; 2) prevents a technician from touching electronics in a manufacturer's portion of the assembly; 3) enables a higher quantity of electrical connectors between chambers of the assembly.

Exemplary embodiments of the electronics enclosure assembly are described above in detail. The electronics enclosure assembly and its components are not limited to the specific embodiments described herein, but rather, components of the systems may be utilized independently and separately from other components described herein. For example, the components may also be used in combination with other machine systems, methods, and apparatuses, and are not limited to practice with only the systems and apparatus as described herein. Rather, the exemplary embodiments can be implemented and utilized in connection with many other applications.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the invention, including the best mode, and to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electronics enclosure assembly comprising:
    a housing comprising:
        a first chamber;
        a second chamber; and
        a first wall coupled between said first chamber and said second chamber;
        a third chamber;
        a second wall fixedly coupled to said first wall and positioned between said second chamber and said third chamber, wherein said first wall is coupled between first and third chamber; and
    at least one plate coupled to said housing, wherein said first wall and said plate combine to define a first channel extending through said first wall, wherein said first channel couples said first chamber in communication with said second chamber, wherein said first wall and said plate combine to define a second channel extending through said first wall, wherein said second channel couples said first chamber in communication with said third chamber, said first wall comprising a wall chamber defined therein and oriented parallel to said first wall, said wall chamber configured to couple said first channel in flow communication with said second channel.

2. The electronics enclosure assembly in accordance with claim 1, wherein said first chamber comprises a first surface, said second chamber comprises a second surface, and said plate comprises a plate surface that is parallel to and vertically offset from said first and second surfaces.

3. The electronics enclosure assembly in accordance with claim 1, wherein said first channel includes a first sidewall extending between said plate and said first chamber and a second sidewall extending between said plate and said second chamber, wherein at least one of said first and said second sidewalls is obliquely oriented with respect to said plate.

4. The electronics enclosure assembly in accordance with claim 3, wherein said first sidewall comprises a first portion extending from said plate toward said first chamber and a second portion extending from said first chamber toward said plate.

5. The electronics enclosure assembly in accordance with claim 4, wherein said second portion is obliquely oriented with respect to a bottom surface of said first chamber.

6. The electronics enclosure assembly in accordance with claim 1, wherein said plate comprises an opening configured to drain fluid from within said first channel.

7. The electronics enclosure assembly in accordance with claim 1, wherein said at least one plate comprises a first plate coupled to said housing to define said first channel and a second plate coupled to said housing to define said second channel, wherein said first and said second plates each comprise an opening configured to drains fluid from said first and said second channels.

8. The electronics enclosure assembly in accordance with claim 1, wherein said plate at least partially defines said wall chamber, wherein said plate comprises an opening aligned with said wall chamber and configured to drain said wall chamber of fluid.

9. The electronics enclosure assembly in accordance with claim 1, wherein said first channel is oriented parallel to said second channel.

10. The electronics enclosure assembly in accordance with claim 1, wherein said wall chamber is oriented substantially perpendicular to said first channel and to said second channel.

11. The electronics enclosure assembly in accordance with claim 1, wherein said plate at least partially defines said first channel, said second channel, and said wall chamber.

12. A housing for use with an electronics enclosure assembly, said housing comprising:
    a first chamber;
    a second chamber; and
    a first wall coupled between said first chamber and said second chamber;
    a first channel extending through said first wall, wherein said first channel couples said first chamber in communication with said second chamber, said first channel comprising:
        a bottom opening;
        a first sidewall extending between said bottom opening and said first chamber; and
        a second sidewall extending between said bottom opening and said second chamber, wherein at least one of said first and said second sidewalls is obliquely oriented;
    a third chamber and a second wall between said second chamber and said third chambers, wherein said first wall is coupled between first and third chamber; and
    a second channel extending through said first wall to couple said first chamber in communication with said third chamber, wherein said first wall comprises a wall chamber defined therein and oriented parallel to said first wall, said wall chamber configured to couple said first channel in flow communication with said second channel.

13. The housing in accordance with claim 12, wherein said first sidewall comprises a first portion extending from said bottom opening toward said first chamber and a second portion extending from said first chamber toward said bottom opening.

14. The housing in accordance with claim 13, wherein said second portion is obliquely oriented with respect to a bottom surface of said first chamber.

15. The housing in accordance with claim 12, wherein said first channel is one of V-shaped or U-shaped.

16. An electronics enclosure assembly comprising:
a housing comprising:
   a first chamber;
   a second chamber; and
   a first wall coupled between said first chamber and said second chamber;
   a third chamber;
   a second wall coupled between said second chamber and said third chamber, wherein said first wall is coupled between first and third chamber; and at least one plate coupled to said housing, wherein said first wall and said plate combine to define a first channel extending through said first wall, wherein said first channel couples said first chamber in communication with said second chamber, wherein said first wall and said plate combine to define a second channel extending through said first wall, wherein said second channel couples said first chamber in communication with said third chamber, said first wall comprising a wall chamber defined therein and oriented parallel to said first wall, said wall chamber configured to couple said first channel in flow communication with said second channel, wherein said first channel includes a first sidewall extending between said plate and said first chamber and a second sidewall extending between said plate and said second chamber, wherein at least one of said first and said second sidewalls is obliquely oriented with respect to said plate.

* * * * *